(12) United States Patent
Halimaoui

(10) Patent No.: US 7,569,482 B2
(45) Date of Patent: Aug. 4, 2009

(54) METHOD FOR THE SELECTIVE REMOVAL OF AN UNSILICIDED METAL

(75) Inventor: Aomar Halimaoui, La Terrasse (FR)

(73) Assignee: STMicroelectronics (Crolles 2) SAS, Crolles Cedex (FR)

( * ) Notice: Subject to any disclaimer, the term of this patent is extended or adjusted under 35 U.S.C. 154(b) by 254 days.

(21) Appl. No.: 11/654,388

(22) Filed: Jan. 15, 2007

(65) Prior Publication Data

US 2007/0197029 A1    Aug. 23, 2007

(30) Foreign Application Priority Data

Jan. 18, 2006  (FR)  .................... 06 00436

(51) Int. Cl.
- H01L 21/302 (2006.01)
- H01L 21/461 (2006.01)
- H01L 21/4763 (2006.01)
- H01L 21/44 (2006.01)

(52) U.S. Cl. ............ 438/658; 438/752; 438/755; 438/650; 438/651

(58) Field of Classification Search .......... 438/755, 438/752, 705, 650–651
See application file for complete search history.

(56) References Cited

U.S. PATENT DOCUMENTS

| | | | |
|---|---|---|---|
| 4,248,688 A | 2/1981 | Gartner et al. | |
| 5,401,674 A | 3/1995 | Anjum et al. | |
| 2004/0178476 A1* | 9/2004 | Brask et al. | 257/616 |
| 2005/0089686 A1* | 4/2005 | Johnson et al. | 428/408 |
| 2005/0156258 A1 | 7/2005 | Park et al. | |
| 2005/0282324 A1* | 12/2005 | Ohuchi | 438/198 |
| 2007/0123042 A1* | 5/2007 | Rim et al. | 438/683 |

OTHER PUBLICATIONS

Preliminary French Search Report, FR 06 00436, dated Sep. 11, 2006.

* cited by examiner

Primary Examiner—Ha Tran T Nguyen
Assistant Examiner—Valerie Brown
(74) Attorney, Agent, or Firm—Gardere Wynne Sewell LLP

(57) ABSTRACT

An integrated circuit is silicided by depositing at least one metal on a silicon-containing region and forming a metal silicide. Residue metal that has not been silicided during the formation of the metal silicide is then removed. The removal of the residue metal involves the conversion of the residue metal to an alloy containing the germanide of said metal with minimal if any adverse affect on the silicide. Next, the alloy is removed, in a manner selective to the silicide, by dissolving the alloy in a chemical solution.

21 Claims, 2 Drawing Sheets

METHOD FOR THE SELECTIVE REMOVAL OF AN UNSILICIDED METAL

PRIORITY CLAIM

The present application claims priority from French Application for Patent No. 06 00436 filed Jan. 18, 2006, the disclosure of which is hereby incorporated by reference.

BACKGROUND OF THE INVENTION

1. Technical Field of the Invention

The present invention relates to integrated circuits, and more particularly to the formation of a metal silicide on an integrated circuit component.

2. Description of Related Art

The production of microelectronic components often includes a step of siliciding part of said component. The siliciding step consists in the formation of a metal silicide on a silicon zone. This step most particularly takes place on surfaces that are used as contact surfaces between the microelectronic component and the connection tracks. Silicidation makes it possible to achieve better conductivity at these surfaces thanks to the silicon/metal alloy thus formed, which has a very low contact resistance.

Silicidation methods are currently known and widely used.

Thus, a self-aligned silicidation method for an MOS transistor is conventionally used by those skilled in the art. According to this method, the metal to be silicided is deposited over the entire surface of the transistor, that is to say on the source, drain and gate regions, on the insulating spacers and on the isolating zone (for example of the shallow trench isolation type) which isolates the transistor from the other components of the integrated circuit. A heat treatment is then carried out during which the metal silicide forms between the silicon and the metal in the contact zones, that is to say in the source, drain and gate regions. However, there is no silicidation at the spacers and the isolating zone, which generally consist of silicon oxide or silicon nitride. Finally, the surplus metal remaining on top of the previously formed metal silicide and on top of the spacers and the isolating zone is removed using a chemical solution, the chemical solution being chosen so as to selectively remove the metal, and not its silicide.

Currently, CMOS technologies use nickel silicide (NiSi). An example of a chemical solution for selectively etching nickel and not its silicide is a mixture of sulphuric acid and hydrogen peroxide diluted in water, called an SPM (sulphuric peroxide mixture).

However, for future generations, it is intended to use other silicides, such as platinum silicide (PtSi) or iridium silicide (IrSi), which have a lower contact resistance and better stability. It is even envisaged to use silicides of rare earths (such as erbium (Er) or ytterbium (Yb)) for certain architectures.

In the case of platinum, the only currently known chemical solution capable of dissolving it is aqua regia, which is formed from a mixture of concentrated hydrochloric acid, concentrated nitric acid and water. However, aqua regia also attacks platinum silicide, and is therefore not selective with respect to platinum alone. In addition, aqua regia is a chemical solution that is highly corrosive and unstable over time. It is therefore a solution barely compatible with use in an industrial environment.

In the case of iridium, there is no known chemistry that allows it to be dissolved while leaving the silicide behind.

The chemical solution must therefore meet at least two constraints. Firstly, it must be capable of dissolving the unsilicided metal. Secondly, it must not dissolve the silicide of said metal, or do so only slightly. These constraints greatly limit the choice of chemical solution for the new metals envisaged and, in general, result in highly corrosive solutions that are therefore barely usable in an industrial environment.

There is a need to remedy these drawbacks.

SUMMARY OF THE INVENTION

Embodiments of the invention propose a novel method that can be easily applied to the silicidation of the new metals envisaged, while remaining compatible with the metals conventionally used up until now, such as for example nickel.

According to one aspect of the invention, what is proposed is a silicidation method, comprising a deposition of at least one metal on a silicon-containing region, the formation of a metal silicide and the removal of the residue of metal that has not been silicided during the formation of the metal silicide. The removal of the residue of metal comprises: a) the conversion of said residue of metal to an alloy containing the germanide of said metal; and b) the removal of said alloy by dissolving it in a chemical solution.

In other words, the metal layer to be removed is replaced with a layer containing the germanide of the metal, the dissolution of the metal germanide being easier and in general selective with respect to the metal silicide, and which may be carried out by a conventional chemical solution usually employed in the field of semiconductors and microelectronics.

Preferably, the metal comprises at least one of the metals selected from the group consisting of: platinum, iridium, erbium, ytterbium, cobalt and nickel.

Preferably, the chemical solution comprises at least one of the compounds selected from the group consisting of: sulphuric acid, hydrogen peroxide, hydrochloric acid and aqueous ammonia.

These compounds are frequently used in the microelectronics industry. They are thus based on several conventional chemical solutions such as SPM (sulphuric peroxide mixture: a mixture of sulphuric acid and hydrogen peroxide diluted in water), or SC1 (Standard Cleaning 1: a mixture of aqueous ammonia, hydrogen peroxide and water) or SC2 (Standard Cleaning 2: a mixture of hydrochloric acid, hydrogen peroxide and water). The method therefore makes it possible, on the one hand, to remove an unsilicided metal selectively with respect to its silicide and, on the other hand, to do so by means of a conventional chemical solution commonly used in microelectronics.

According to one method of implementation, the conversion of the residue of metal comprises the deposition of a material comprising germanium on said residue of metal, followed by an annealing operation.

Preferably, the material comprising germanium has a germanium content of greater than 20%.

Preferably, the annealing for forming the metal germanide is carried out at a temperature between 100 and 600° C.

According to one embodiment, the material comprising germanium may be deposited by chemical vapor deposition (CVD) with germane ($GeH_4$) as precursor and preferably at a temperature below 400° C.

According to another embodiment, the material comprising germanium may be deposited by plasma-enhanced chemical vapor deposition (PECVD) with germane ($GeH_4$) as precursor and preferably at a temperature below 200° C.

The silicon-containing region is at least one of the source, drain and gate regions of a transistor.

In an embodiment, a method for the selective removal of a residue metal used in the formation of a silicide comprises: converting said residue metal to an alloy containing a germanide of said residue metal; and removing said alloy by dissolving it in a chemical solution.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
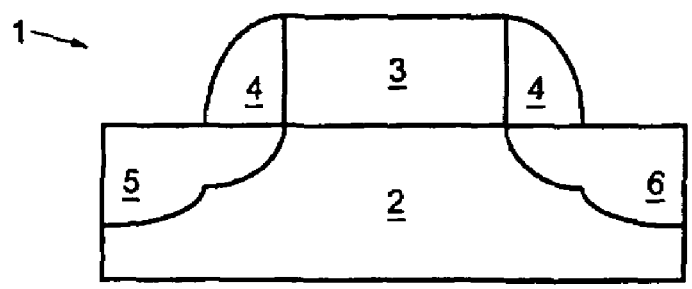
FIGS. 1 to 6 illustrate, very schematically, the main steps of one embodiment of the method according to the invention.

FIG. 1 shows very schematically a cross section through an integrated circuit 1 comprising a transistor produced on a substrate 2. The transistor comprises a gate 3, spacers 4 placed on either side of the gate 3, a source region 5 and a drain region 6.

Figure 2:
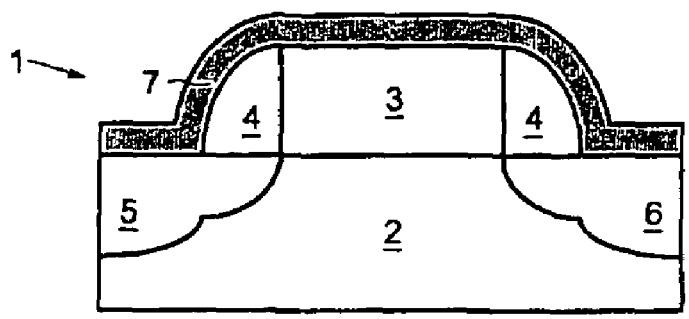

A metal layer 7 is deposited on the surface of the transistor, on top of the source 5, drain 6 and gate 3 regions and on top of the spacers 4. As an example, platinum will be used as the metal. The integrated circuit 1 as shown in FIG. 2 is obtained.

Figure 3:
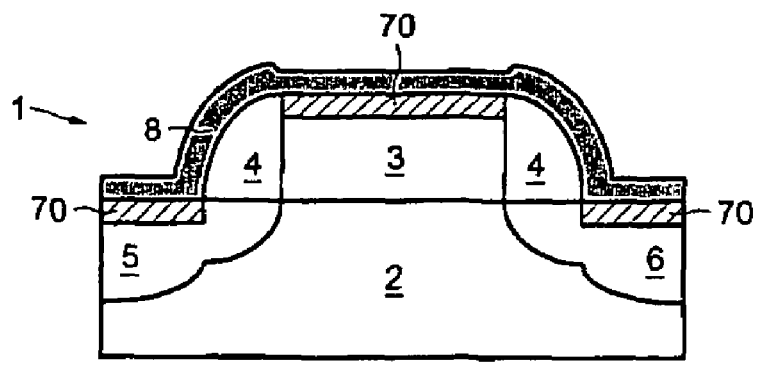

Next, a silicidation step is carried out. During this step, a metal silicide 70, in the present case platinum silicide, is formed in the source 5, drain 6 and gate 3 regions. However, platinum does not react with the spacers 4, which essentially comprise silicon nitride. The unreacted platinum is on the surface of the transistor and forms in a layer of residue of metal 8 (FIG. 3).

Figure 4:
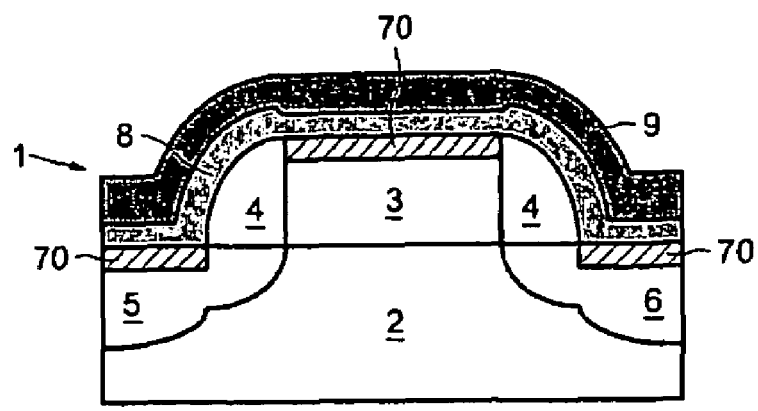

The next step comprises depositing a second layer 9, comprising germanium, on the transistor. This layer covers the previously deposited layer 8 of platinum that has not reacted (cf. FIG. 4). The layer 9 is situated on said layer 70 of platinum silicide at the places where the layer 7 has reacted completely with the silicon of the transistor in order to form the silicide.

Preferably, the layer 9 is deposited at temperatures below 400° C., by chemical vapor deposition (CVD) with germane ($GeH_4$) as precursor. Deposition may also be carried out at temperatures below 200° C. either by plasma-enhanced chemical vapor deposition (PECVD) with germane as precursor, or by any other method such as evaporation or sputtering. It may also be noted that the layer 9 is not necessarily a germanium monolayer. In particular, the layer 9 may be formed from silicon-germanium (SiGe). However, in the latter case, the percentage of germanium of the layer 9 is preferably greater than 20%.

Figure 5:
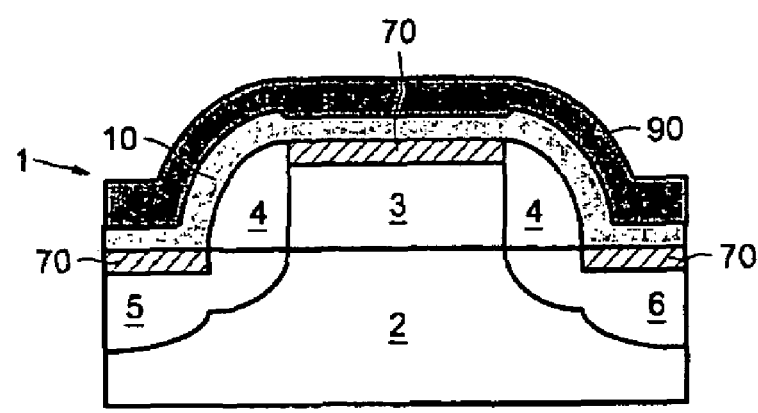

A second heat treatment is then carried out so as to form platinum germanide 10 in the contact zones between the platinum layer 8 that has not been silicided and the layer 9. The heat treatment is carried out so that all the platinum of the layer 8 is converted to platinum germanide 10 (FIG. 5). It should also be noted that, during this conversion, the germanium does not react with the already formed platinum silicide, or does so only very little, since platinum silicide is a more stable material. Thus, the germanium contained in the layer 9 will therefore react most particularly with the platinum of the layer 8. The annealing operation to convert the platinum to platinum germanide is preferably carried out at temperatures between 250° C. and 400° C. After this annealing, a residue of germanide 90 generally remains.

Figure 6:
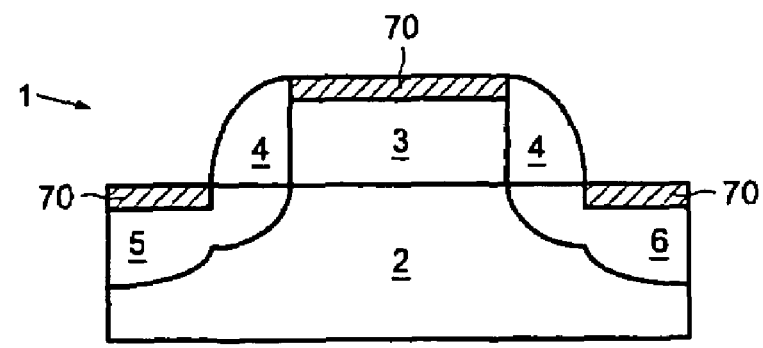

Finally, the layers 90 and 10 are selectively removed using a standard chemical solution. Thus, it is possible to use a solution of the SPM type, or pure sulphuric acid, or an SC1 solution or even an SC2 solution. These solutions are adapted to the industrial environment and are widely used in microelectronics. The chemical solution may also be heated, for example to 70° C., so as to increase the rate of dissolution of the germanium and the platinum germanide. The integrated circuit obtained is that shown in FIG. 6. The transistor has been silicided on its contact surfaces and the surplus platinum has been selectively removed so as to no longer short-circuit the transistor.

The method described above, in the particular case of platinum, also advantageously applies to other metals, such as cobalt, nickel, erbium, ytterbium or even iridium. In particular, in the case of iridium, for which it is known that there is no chemistry capable of dissolving it, the method as presented not only allows iridium to be removed by means of chemical solutions conventionally used by those skilled in the art, but also allows iridium to be removed selectively with respect to its silicide.

It should also be pointed out that these solutions are widely used in the electronic industry and that handling them poses no particular difficulties. In addition, they are less corrosive than aqua regia, for example, and also less expensive.

The method described above may also be combined with the "dual silicide" method which employs two silicides on the same silicon wafer, for example platinum silicide (PtSi) and erbium silicide ($ErSi_2$).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A silicidation method, comprising:
   deposition of at least one metal on a silicon-containing region;
   formation of a metal silicide; and
   removal of a residue of metal that has not been silicided during the formation of the metal silicide, wherein removal of the residue of metal comprises:
   a) conversion of said residue of metal to an alloy containing a germanide of said metal; and
   b) removal of said alloy by dissolving it in a chemical solution.

2. The method according to claim 1, in which the metal comprises at least one of the metals selected from the group consisting of: platinum, iridium, erbium, ytterbium, cobalt and nickel.

3. The method according to claim 1, in which the chemical solution comprises at least one of the compounds selected from the group consisting of: sulphuric acid, hydrogen peroxide, hydrochloric acid and aqueous ammonia.

4. The method according to claim 1, in which said conversion of the residue of metal comprises the deposition of a material comprising germanium on said residue of metal, followed by an annealing operation.

5. The method according to claim 4, in which the material comprising germanium has a germanium content of greater than 20%.

6. The method according to claim 4, in which the annealing is carried out at a temperature between 100 and 600° C.

7. The method according to claim 4, in which the material comprising germanium is deposited by chemical vapor deposition with germane ($GeH_4$) as precursor and preferably at a temperature below 400° C.

8. The method according to claim 4, in which the material comprising germanium is deposited by plasma-enhanced chemical vapor deposition with germane ($GeH_4$) as precursor and preferably at a temperature below 200° C.

9. The method according to claim 1, in which the silicon-containing region is at least one of the source, drain and gate regions of a transistor.

10. A method for the selective removal of a residue metal used in the formation of a silicide, comprising:
   converting said residue metal to an alloy containing a germanide of said residue metal; and
   removing said alloy by dissolving it in a chemical solution.

11. The method of claim 10 wherein the chemical solution is a sulphuric acid.

12. The method of claim 10 wherein the chemical solution is a hydrogen peroxide.

13. The method of claim 10 wherein the chemical solution is a hydrochloric acid.

14. The method of claim 10 wherein the chemical solution is an aqueous ammonia.

15. The method of claim 10 wherein the residue metal is platinum.

16. The method of claim 10 wherein the residue metal is iridium.

17. The method of claim 10 wherein the residue metal is erbium.

18. The method of claim 10 wherein the residue metal is ytterbium.

19. The method of claim 10 wherein the residue metal is cobalt.

20. The method of claim 10 wherein the residue metal is nickel.

21. The method of claim 10, wherein converting comprises depositing a material comprising germanium on said residue of metal; and annealing.

\* \* \* \* \*